US012805380B2

(12) United States Patent
Inoue

(10) Patent No.: US 12,805,380 B2
(45) Date of Patent: Nov. 17, 2026

(54) SEMICONDUCTOR DEVICE INCLUDING A BASE PLATE AND A CASE HAVING CONVEX AND CONCAVE PORTIONS THAT FIT TOGETHER

(71) Applicant: Mitsubishi Electric Corporation, Tokyo (JP)

(72) Inventor: Shingo Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1105 days.

(21) Appl. No.: 17/809,408

(22) Filed: Jun. 28, 2022

(65) Prior Publication Data

US 2023/0108221 A1 Apr. 6, 2023

(30) Foreign Application Priority Data

Sep. 28, 2021 (JP) ................................ 2021-157892

(51) Int. Cl.
*H10W 76/15* (2026.01)
*H10W 70/05* (2026.01)
(Continued)

(52) U.S. Cl.
CPC ......... *H10W 76/15* (2026.01); *H10W 70/093* (2026.01); *H10W 74/114* (2026.01); *H10W 76/60* (2026.01); *H10W 72/884* (2026.01)

(58) Field of Classification Search
CPC . H01L 23/053; H01L 21/4853; H01L 2/3121; H01L 24/73; H01L 2224/48091; H01L 2224/73265
See application file for complete search history.

(56) References Cited

U.S. PATENT DOCUMENTS 6,229,702 B1 * 5/2001 Tao .................... H10W 40/778 257/796
2018/0040534 A1 * 2/2018 Shigeta ............... H10W 40/255
(Continued)

FOREIGN PATENT DOCUMENTS

JP S57-195837 U 12/1982
JP S61-051745 U 4/1986
(Continued)

OTHER PUBLICATIONS

An Office Action; "Notice of Reasons for Refusal," mailed by the Japanese Patent Office on Nov. 12, 2024, which corresponds to Japanese Patent Application No. 2021-157892 and is related to U.S. Appl. No. 17/809,408; with English language translation.
(Continued)

*Primary Examiner* — Sue A Purvis
(74) *Attorney, Agent, or Firm* — Studebaker Brackett PLLC

(57) ABSTRACT

It is an object to provide a technique capable of performing appropriate fitting in a base plate and a case. A semiconductor device includes: a semiconductor element, an insulating substrate on which the semiconductor element is mounted; a base plate on which the insulating substrate is mounted; and a case mounted on the base plate to surround the semiconductor element and the insulating substrate. One or more convex portions each having a tapered shape are provided in one of a surface of the base plate and a surface of the case, and one or more concave portions each having a tapered shape to be fitted to the one or more convex portions are provided in the other one of the surface of the base plate and the surface of the case.

7 Claims, 8 Drawing Sheets

(51) Int. Cl.

| | |
|---|---|
| ***H10W 72/00*** | (2026.01) |
| ***H10W 74/10*** | (2026.01) |
| ***H10W 76/60*** | (2026.01) |

(56) References Cited

U.S. PATENT DOCUMENTS

| | | | | |
|---|---|---|---|---|
| 2020/0219782 | A1* | 7/2020 | Hitomi | H02M 7/003 |
| 2021/0020609 | A1* | 1/2021 | Takaku | H01L 24/92 |
| 2021/0257269 | A1* | 8/2021 | Taniguchi | H10W 76/15 |
| 2022/0068743 | A1* | 3/2022 | Enomoto | H10W 40/255 |
| 2023/0005805 | A1* | 1/2023 | Takahashi | H01L 25/0657 |

FOREIGN PATENT DOCUMENTS

| | | | | | |
|---|---|---|---|---|---|
| JP | H08-032041 | A | | 2/1996 | |
| JP | H0832041 | A | * | 2/1996 | |
| JP | H09275155 | A | * | 10/1997 | |
| JP | H11-312782 | A | | 11/1999 | |
| JP | 2006011185 | A | * | 1/2006 | |
| JP | 2010-251614 | A | | 11/2010 | |
| JP | 2012049194 | A | * | 3/2012 | |
| JP | 2015167171 | A | * | 9/2015 | |
| JP | 2018022777 | A | * | 2/2018 | H10W 72/60 |
| WO | WO-2005055296 | A1 | * | 6/2005 | G03F 7/7085 |
| WO | WO-2018055667 | A1 | * | 3/2018 | H10W 90/701 |
| WO | 2019/049400 | A1 | | 3/2019 | |
| WO | WO-2020231871 | A1 | * | 11/2020 | H01L 21/4846 |
| WO | WO-2022116055 | A1 | * | 6/2022 | G06F 3/041 |

OTHER PUBLICATIONS

An Office Action; "Notice of Reasons for Refusal," mailed by the Japanese Patent Office on Aug. 20, 2024, which corresponds to Japanese Patent Application No. 2021-157892 and is related to U.S. Appl. No. 17/809,408; with English language translation.

An Office Action; mailed by the China National Intellectual Property Administration of the People's Republic of China on Jun. 30, 2026, which corresponds to Chinese Patent Application No. 202211166118.2 and is related to U.S. Appl. No. 17/809,408.

Office Action issued in DE 10 2022 119 853.7; mailed by the German Patent and Trademark Office on Jul. 1, 2026.

* cited by examiner

SEMICONDUCTOR DEVICE INCLUDING A BASE PLATE AND A CASE HAVING CONVEX AND CONCAVE PORTIONS THAT FIT TOGETHER

BACKGROUND OF THE INVENTION

Field of the Invention

The present disclosure relates to a semiconductor device.

Description of the Background Art

Proposed conventionally is a semiconductor device including a base plate and a case. For example, Japanese Patent Application Laid-Open No. 11-312782 proposes a technique of fitting a convex portion provided in one of a base plate and a case to a concave portion provided in the other one thereof.

SUMMARY

In the technique in Japanese Patent Application Laid-Open No. 11-312782, the convex portion and the concave portion are provided perpendicular to a surface in which they are provided. Such a technique has a problem that a positional deviation is large when a margin of a dimension of the convex portion and the concave portion is large, and when the margin of the dimension of the convex portion and the concave portion is small, large force is necessary to fit the portions or the portions cannot be fitted to each other.

The present disclosure therefore has been made to solve the above problems, and it is an object to provide a technique capable of performing appropriate fitting in a base plate and a case.

A semiconductor device according to the present disclosure includes: a semiconductor element; an insulating substrate on which the semiconductor element is mounted; a base plate on which the insulating substrate is mounted; and a case mounted on the base plate to surround the semiconductor element and the insulating substrate, wherein one or more convex portions each having a tapered shape are provided in one of a surface of the base plate and a surface of the case, and one or more concave portions each having a tapered shape to be fitted to the one or more convex portions are provided in another one of the surface of the base plate and the surface of the case.

An appropriate fitting can be performed in the base plate and the case.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
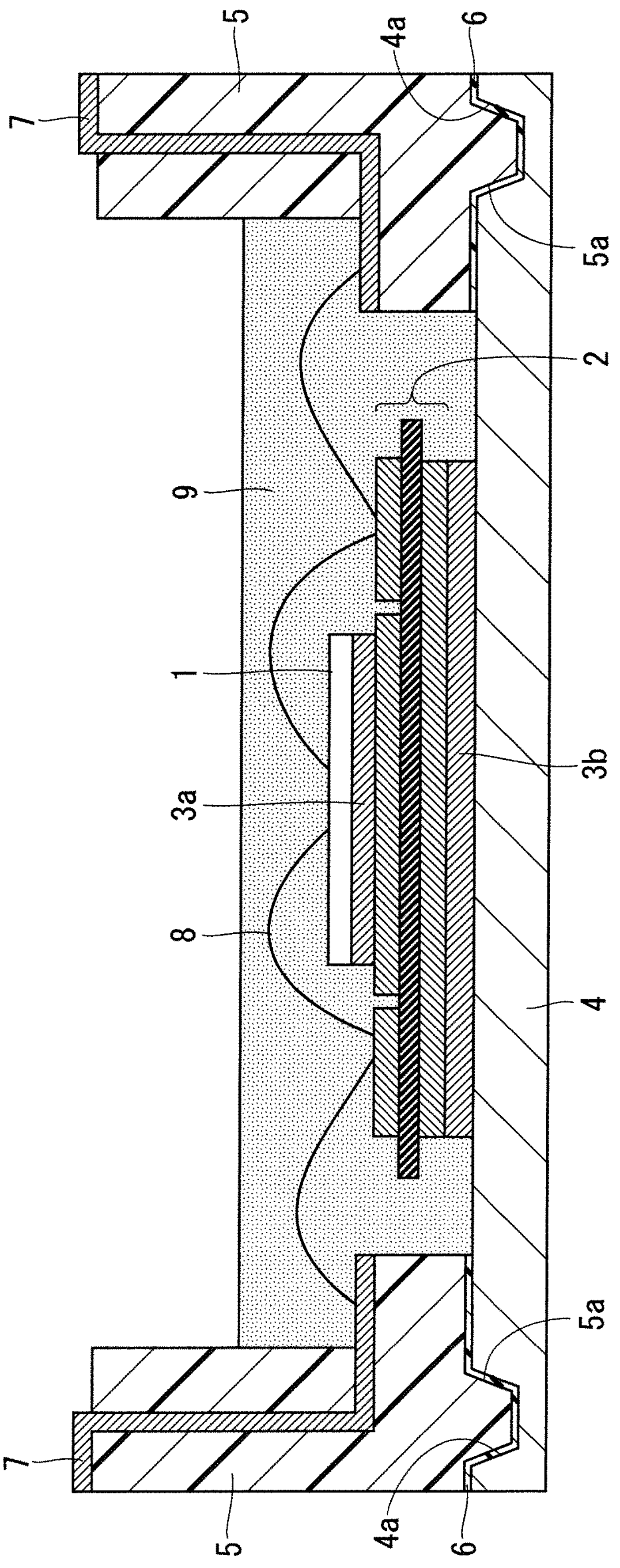
FIG. 1 is a cross-sectional view illustrating a configuration of a semiconductor device according to an embodiment 1.

Embodiments are described with reference to the appended drawings hereinafter. Features described in each embodiment described below is exemplification, thus all features are not necessarily applied. The same or similar reference numerals will be assigned to similar constituent elements in a plurality of embodiments in the description hereinafter, and the different constituent elements are mainly described hereinafter. A specific position and direction such as "upper side", "lower side", "left", "right", "front side", or "back side", for example, may not necessarily coincide with a position and direction in an actual implementation in the description hereinafter.

Embodiment 1

FIG. 1 is a cross-sectional view illustrating a configuration of a semiconductor device according to the present embodiment 1. Described hereinafter is an example of a case where the semiconductor device is a power semiconductor device.

A semiconductor device in FIG. 1 includes a semiconductor element 1, an insulating substrate 2, a joint parts 3*a* and 3*b*, a base plate 4, a case 5, an adhesive agent 6, an electrode 7, a metal wire 8, and a sealing member 9.

The semiconductor element 1 includes a power semiconductor element such as a metal oxide semiconductor field effect transistor (MOSFET), an insulated gate bipolar transistor (IGBT), a Schottky barrier diode (SBD), a PN junction diode (PND), or a reverse conducting IGBT (RC-IGBT), for example.

A material of the semiconductor element 1 may be normal silicon (Si) or a wide bandgap semiconductor. The wide bandgap semiconductor includes silicon carbide (SiC) or gallium nitride (GaN), for example. When a material of the semiconductor element 1 is a wide bandgap semiconductor, the semiconductor element 1 can be appropriately operated under high withstand voltage, high frequency, and high temperature.

In FIG. 1, the number of the semiconductor elements 1 in one case 5 is one, however, the configuration is not limited thereto. Also applicable is a configuration that the number of the semiconductor elements 1 in one case 5 is two (that is to say, 2 in 1 configuration) or a configuration that the number of the semiconductor elements 1 in one case 5 is six (that is to say, 6 in 1 configuration).

The semiconductor element 1 is mounted on the insulating substrate 2. The insulating substrate 2 includes an insulating layer part and first and second circuit pattern parts provided on both surfaces of the insulating layer part. Examples of a material of the insulating layer part include alumina ($Al_2O_3$), aluminum nitride (AlN), and silicon nitride ($Si_3N_4$). A material of the first and second circuit pattern parts include a copper (Cu), aluminum (Al), or alloy thereof, for example.

The semiconductor element 1 and the first circuit pattern part of the insulating substrate 2 are joined by the joint part 3*a*. A material of the joint part 3*a* is a metal joint member, for example. The metal joint member may include solder made of zinc (Pb) and tin (Sn), for example, solder alloy, a sintering member made of nano-silver, or a sintering member made of nano-copper particles.

The insulating substrate 2 is mounted on the base plate 4. Examples of a material of the base plate 4 may include a metal material such as copper, aluminum, or copper-molybdenum alloy (CuMo), or a complex material such as silicon carbide-aluminum complex member (AlSiC) or silicon carbide-magnesium complex member (MgSiC). Examples of the material of the base plate 4 may include an organic material such as epoxy resin, polyimide resin, acrylic resin, or polyphenylene sulfide (PPS).

The second circuit pattern part of the insulating substrate 2 and the base plate 4 are joined by the joint part 3*b*. A material of the joint part 3*b* may be the same as or different from that of the joint part 3*a*.

The case 5 is mounted on the base plate 4 and surrounds the semiconductor element 1 and the insulating substrate 2. Any material having an electrical insulation property is applicable to a material of the case 5, and examples thereof include PPS, PBT, or PET-PBT resin.

A gap is provided between the base plate 4 and the case 5, and the adhesive agent 6 is provided in the gap. A silicon series adhesive agent is generally used for the adhesive agent 6, however, a material of the adhesive agent 6 may include an acrylic series resin or epoxy resin, for example.

The electrode 7 is provided integrally with the case 5. The electrode 7 includes a first end portion and a second end portion exposed from the case 5, and the second end portion is provided on the side opposite to the first end portion with respect to case 5. A material of the electrode 7 includes metal mainly made up copper or alloy thereof. A surface of the electrode 7 preferably includes a plating layer made of nickel (Ni), for example, but may not include a plating layer.

The metal wire 8 electrically connects the semiconductor element 1 to the first circuit pattern part of the insulating substrate 2 and electrically connects the first circuit pattern part to the first end portion of the electrode 7. The metal wire 8 may be a metal wiring made of copper (Cu), aluminum (Al), or alloy thereof, for example.

The sealing member 9 seals a collected body surrounded by the base plate 4 and the case 5 as a sealed body. Although not shown in FIG. 1, the sealed body may include a control base plate controlling the semiconductor element 1. The material of the sealing member 9 includes, for example, a silicon gel or insulative resin such as epoxy resin.

Herein, as illustrated in FIG. 1, a convex portion 5*a* having a tapered shape is provided on the surface (a lower surface in FIG. 1) of the case 5, and a concave portion 4*a* having a tapered shape is provided to be fitted to the convex portion 5*a* in a surface (an upper surface in FIG. 1) of the base plate 4.

A sidewall of the convex portion 5*a* is inclined at an angle of 15 to 30 degrees with respect to a vertical direction of the surface of the case 5, thus the convex portion 5*a* has a tapered shape tapered toward a tip end portion thereof. A sidewall of the concave portion 4*a* is inclined similarly to the sidewall of the convex portion 5*a* with respect to a vertical direction of the surface of the base plate 4, thus the concave portion 4*a* has a tapered shape tapered toward a bottom portion thereof. A depth of the concave portion 4*a* is ⅓ to ⅔ of a thickness of the base plate 4, for example. A gap is provided between the convex portion 5*a* and the concave portion 4*a* facing each other, and the adhesive agent 6 is provided in the gap. The adhesive agent 6 is preferably provided in the gap under reduced pressure in manufacturing the semiconductor device.

In the example in FIG. 1, the plurality of convex portions 5*a* having the same shape are provided on the surface of the case 5, the plurality of concave portions 4*a* having the same shape are provided in the surface of the base plate 4, and the plurality of convex portions 5*a* and the plurality of concave portions 4*a* are fitted to each other, however, the configuration is not limited thereto. For example, the number of each of the convex portions 5*a* and the concave portions 4*a* may be one.

In a configuration that the base plate 4 is made of metal and the case 5 is made of resin, it is applicable that the concave portion 4*a* of the base plate 4 is formed by press working, for example, and the convex portion 5*a* of the case 5 is formed by integral molding, for example.

A positional relationship between the convex portion and the concave portion in FIG. 1 may be reversed. That is to say, it is also applicable that a convex portion having a tapered shape is provided on the surface of the base plate 4, and a concave portion having a tapered shape is provided in the surface of the case 5.

The convex portion 5*a* and the concave portion 4*a* may have a tapered shape with two or more levels. That is to say, a cross-sectional shape of the sidewall of the convex portion 5*a* and the concave portion 4*a* may be a straight shape bended at one or more positions or a semicircular shape with a illimitably large number of levels.

In the example in FIG. 1, the convex portion 5*a* and the concave portion 4*a* are provided immediately below the electrode 7 embedded in the case 5. According to such a configuration, a deviation of the electrode 7 from a designed position to the base plate 4 can be suppressed, thus a positional deviation causing a defect in attaching a semiconductor device to an external device can be suppressed.

Figure 2:
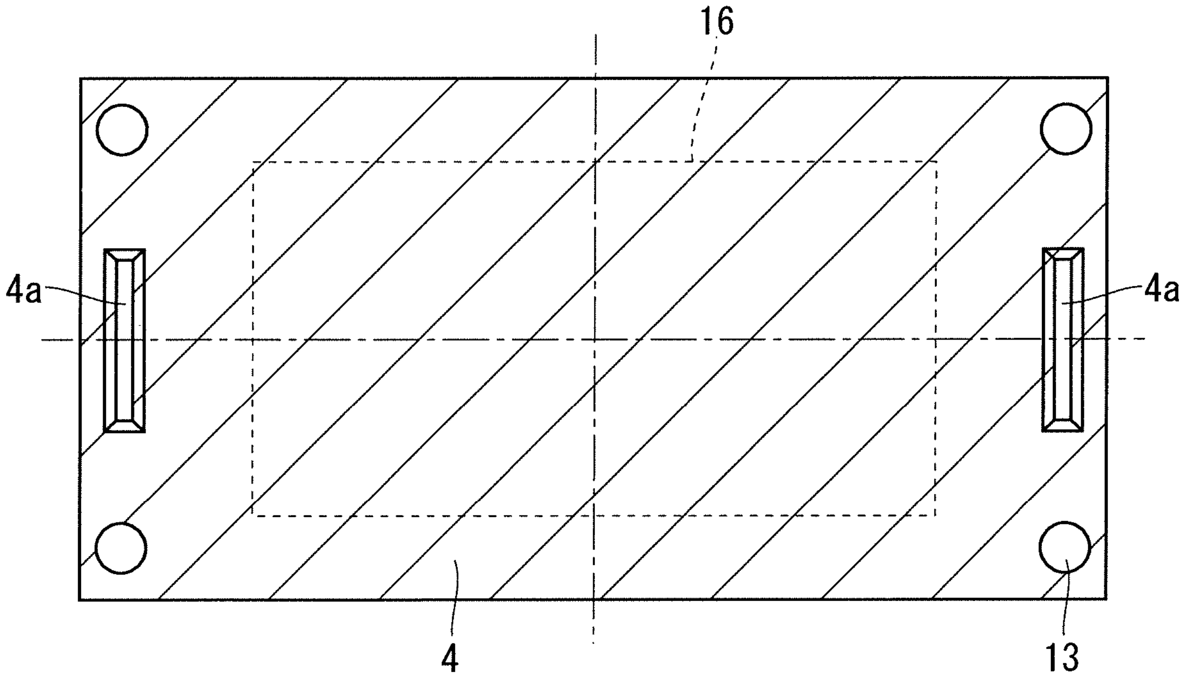
FIG. 2 is a plan view illustrating a configuration of a part of the semiconductor device according to the embodiment 1.

FIG. 2 is a plan view of the base plate 4 viewed from a side of the insulating substrate 2 according to the present embodiment 1. FIG. 2 illustrates positions and shapes of the plurality of concave portions 4*a* in a plan view and an attaching hole 13 for attaching the case 5 to the base plate 4. In FIG. 2, a case mounting region 16 as a region where the surface of the base plate 4 and the surface of the case 5 face each other is indicated by a dotted line. Although not shown in FIG. 2, positions and shapes of the plurality of convex portions 5*a* in a plan view correspond to the positions and the shapes of the plurality of concave portions 4*a* in a plan view.

In the example in FIG. 2, the plurality of concave portions 4*a* are symmetrically disposed in the base plate 4 in a plan view. The symmetry herein includes a line symmetry regarding a line in a short side direction or a line in a longitudinal direction passing through a center point of the base plate 4 or a point symmetry regarding a center point of the base plate 4. Although not shown in the drawings, the plurality of convex portions 5*a* are also symmetrically disposed in the case 5 in a plan view.

In the example in FIG. 2, the plurality of concave portions 4*a* may be provided along a short side of the base plate 4, however, it is also applicable that they are provided along a long side or both the short side and long side of the base plate 4, or they are provided in positions of the case mounting region 16 other than the positions described above.

In the example in FIG. 2, the shape of the concave portion 4*a* is a quadrangular shape having sides each having a length of approximately 5 to 50 mm, however, the configuration is not limited thereto. For example, the shape of the concave portion 4*a* may be a polygonal shape other than the quadrangular shape or a shape made up of a combination of polygonal shapes such as a T-like shape.

Outline of Embodiment 1

According to the semiconductor device according to the present embodiment 1 described above, one or more convex portions are provided on one of the surface of the base plate 4 and the surface of the case 5, and one or more concave portions fitted to the one or more convex portions are provided in the other one of the surface of the base plate 4 and the surface of the case 5. According to such a configuration, a positional deviation between the base plate 4 and the case 5 in a translational direction and a rotational direction can be suppressed.

In the present embodiment 1, each of the convex portion and the concave portion has a tapered shape, thus the convex portion and the concave portion are guided to appropriate positions. Accordingly, the positional deviation can be suppressed regardless of a margin of dimensions of the convex portion and the concave portion, and fitting can be facilitated, thus appropriate fitting can be performed in the base plate 4 and the case 5. As a result, a fitting operation becomes more efficient and assemblability of the semiconductor device is improved, and moreover, a failure rate of the semiconductor device is reduced, thus a manufacturing cost of the semiconductor device can be reduced.

When fluid passes through the gap between the base plate 4 and the case 5 from an outer side thereof to reach electrical components of the semiconductor element 1 and the insulating substrate 2 located in an inner space surrounded by the base plate 4 and the case 5, reduction in insulation property of the electrical components occurs, and performance of lifetime is deteriorated, for example. In contrast, in the present embodiment 1, a creeping distance from the outer side of the base plate 4 and the case 5 to the inner space can be increased, and the adhesive agent 6 is provided in a creepage surface thereof, thus fluid reaching the electrical components can be suppressed.

When the material of the adhesive agent 6 is a silicone series material, for example, characteristics such as the insulation property is reduced by occurrence of air bubble, for example. Thus, the sealing member 9 such as epoxy resin or silicone gel may be provided between a gap between the convex portion and the concave portion in place of the adhesive agent 6. It is also applicable that the adhesive agent 6 is provided in a part of the gap, and the sealing member 9 is provided in a remaining part of the gap. In a case where fluid reaching the electrical components can be sufficiently suppressed with no adhesion of the convex portion and the concave portion, for example, the adhesive agent 6 needs not be provided in the gap.

Modification Example of Embodiment 1

Figure 3:
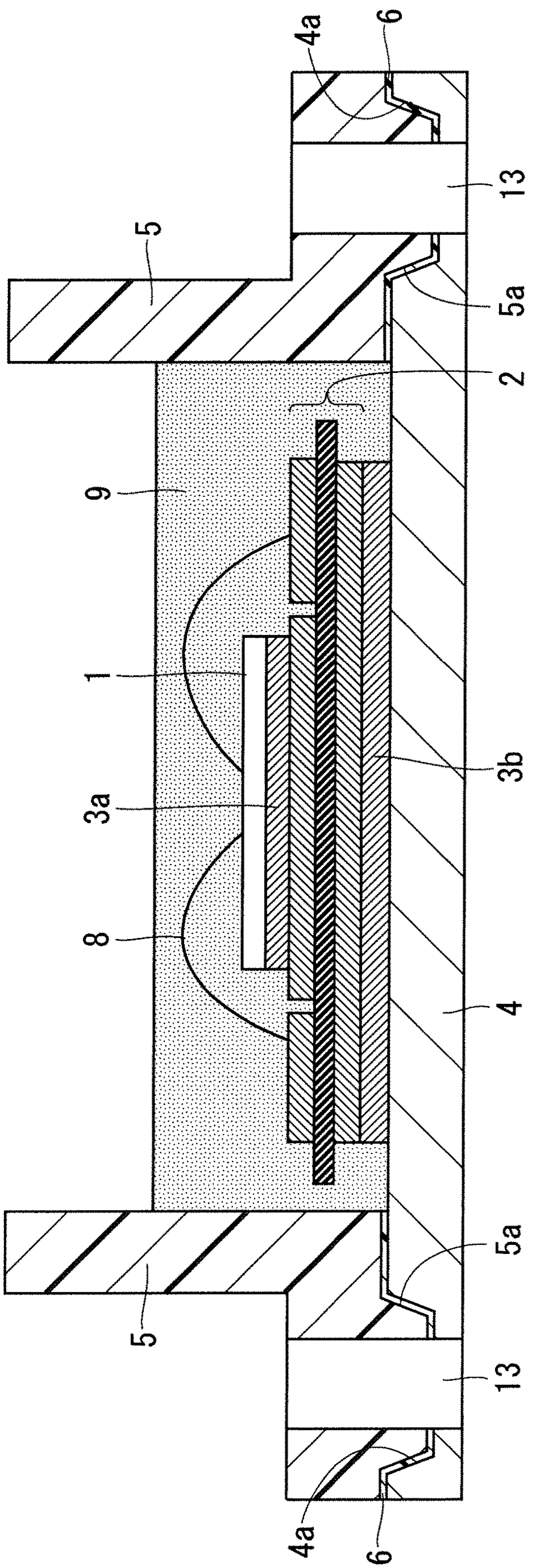
FIG. 3 is a cross-sectional view illustrating a configuration of a semiconductor device according to a modification example of the embodiment 1.

FIG. 3 is a cross-sectional view illustrating a configuration of a semiconductor device according to a modification example of the embodiment 1. In the embodiment 1, the positions of the concave portion 4*a* and the convex portion 5*a* and the position of the attaching hole 13 are different from each other as illustrated in FIG. 2, however, the positions of the concave portion 4*a* and the convex portion 5*a* and the position of the attaching hole 13 may be overlapped with each other as illustrated in FIG. 3.

Embodiment 2

Figure 4:
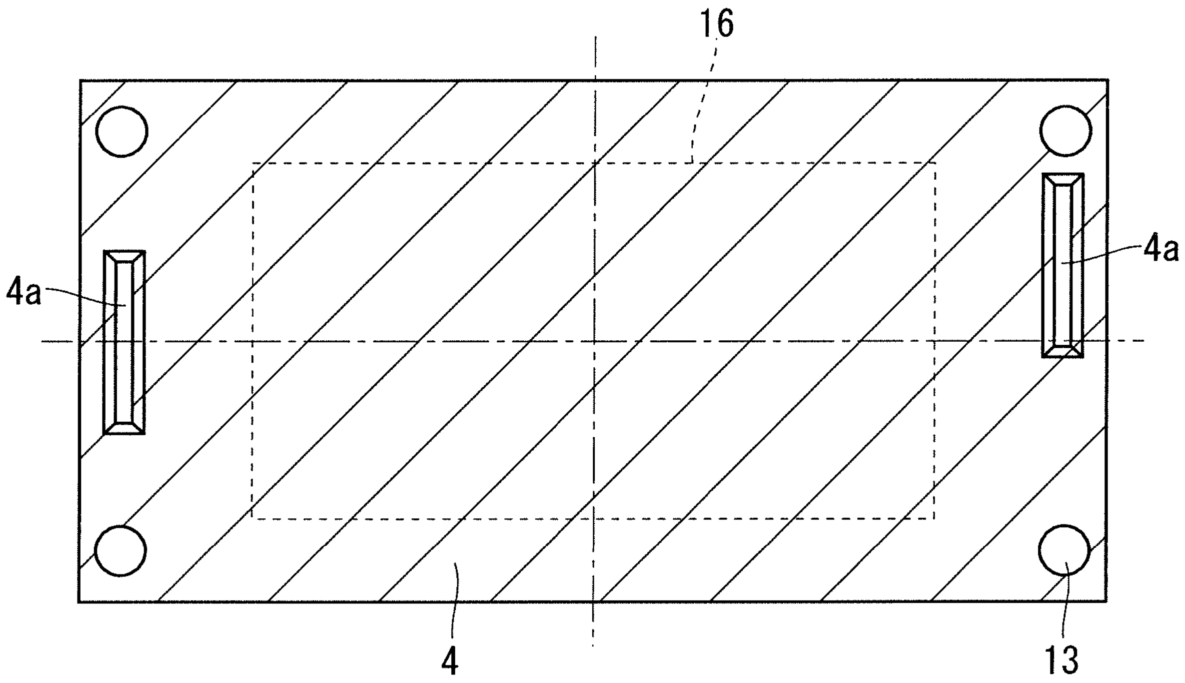
FIG. 4 is a plan view illustrating a configuration of a part of a semiconductor device according to an embodiment 2.

FIG. 4 is a plan view of the base plate 4 viewed from a side of the insulating substrate 2 according to the present embodiment 2. Although not shown in FIG. 4, positions and shapes of the plurality of convex portions 5*a* in a plan view correspond to the positions and the shapes of the plurality of concave portions 4*a* in a plan view.

In the present embodiment 2, the plurality of concave portions 4*a* are asymmetrically disposed in the base plate 4 in a plan view as illustrated in FIG. 4. That is to say, the plurality of concave portions 4*a* are not line-symmetrically or point-symmetrically disposed in the base plate 4 in a plan view. In the example in FIG. 4, the plurality of concave portions 4*a* are provided along the short side of the base plate 4, however, the configuration is not limited thereto. For example, it is also applicable that the plurality of concave portions 4*a* are provided in position other than position along the short side, or one concave portion 4*a* is asymmetrically disposed in the base plate 4 in a plan view.

Although not shown in the drawings, the plurality of convex portions 5*a* are also asymmetrically disposed in the case 5 in a plan view. It is also applicable also in the present embodiment 2 that the convex portion is provided on the surface of the base plate 4 and the concave portion is provided in the surface of the case 5 in the manner similar to the embodiment 1.

Outline of Embodiment 2

In the embodiment 1, one or more convex portions or one or more concave portions are symmetrically disposed in the base plate 4 or the case 5 in a plan view as illustrated in FIG. 2. In such a configuration, even when the case 5 is rotated by 180 degrees from a designed state with respect to the base plate 4, the case 5 can be fitted to the base plate 4, thus there is a possibility that an erroneous assembly performed.

In the meanwhile, in the present embodiment 2, one or more convex portions or one or more concave portions are asymmetrically disposed in the base plate 4 or the case 5 in a plan view. According to such a configuration, when the case 5 is rotated by 180 degrees from a designed state with respect to the base plate 4, the convex portion and the concave portion are not fitted to each other in one or more groups of convex portion and the concave portion, thus an error in assembly can be suppressed. As a result, a failure rate of the semiconductor device caused by the error in assembly is reduced in a configuration that the electrode 7 is not symmetrically disposed in the case 5 or a configuration that the shape of the base plate 4 or the case 5 is not symmetrical, thus a manufacturing cost of the semiconductor device can be reduced.

Embodiment 3

Figure 5:
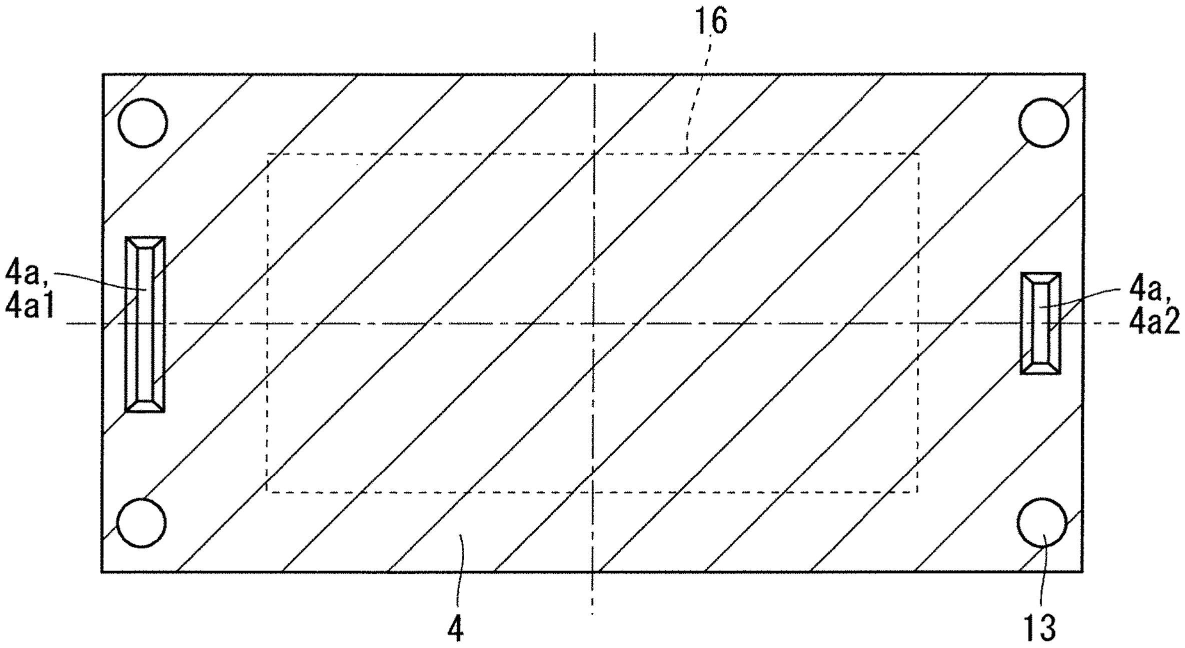
FIG. 5 is a plan view illustrating a configuration of a part of a semiconductor device according to an embodiment 3.

FIG. 5 is a plan view of the base plate 4 viewed from a side of the insulating substrate 2 according to the present embodiment 3. Although not shown in FIG. 5, positions and shapes of the plurality of convex portions 5*a* in a plan view correspond to the positions and the shapes of the plurality of concave portions 4*a* in a plan view.

In the present embodiment 3, the plurality of concave portions 4*a* include a first concave portion 4*a*1 and a second concave portion 4*a*2 having shapes different from each other in a plan view as illustrated in FIG. 5. In FIG. 5, as an example thereof, at least a part of a size of a shape of the first concave portion 4*a*1 (for example, a size in a vertical direction) and at least a part of a size of a shape of the second concave portion 4*a*2 (for example, a size in a vertical direction) are different from each other. Although not shown in the drawings, a type of the shape of the first concave portion 4*a*1 and a type of the shape of the second concave portion 4*a*2 may be different from each other as with a case where the shape of the first concave portion 4*a*1 is a quadrangular shape and the shape of the second concave portion 4*a*2 is a round shape.

Although not shown in the drawings, the plurality of convex portions 5*a* also include the first convex portion and the second convex portion having shapes different from each other in a plan view. It is also applicable also in the present embodiment 3 that the convex portion is provided on the surface of the base plate 4 and the concave portion is provided in the surface of the case 5 in the manner similar to the embodiment 1.

Outline of Embodiment 3

In the semiconductor device according to the present embodiment 3, the plurality of convex portions include the first convex portion and the second convex portion having shapes different from each other in a plan view, and the plurality of concave portions include the first concave portion and the second concave portion having shapes different from each other in a plan view. According to such a configuration, when the case 5 is rotated by 180 degrees from a designed state with respect to the base plate 4, the convex portion and the concave portion are not fitted to each other in one or more groups of convex portion and the concave portion, thus an error in assembly can be suppressed in the manner similar to the embodiment 2.

Figure 6:
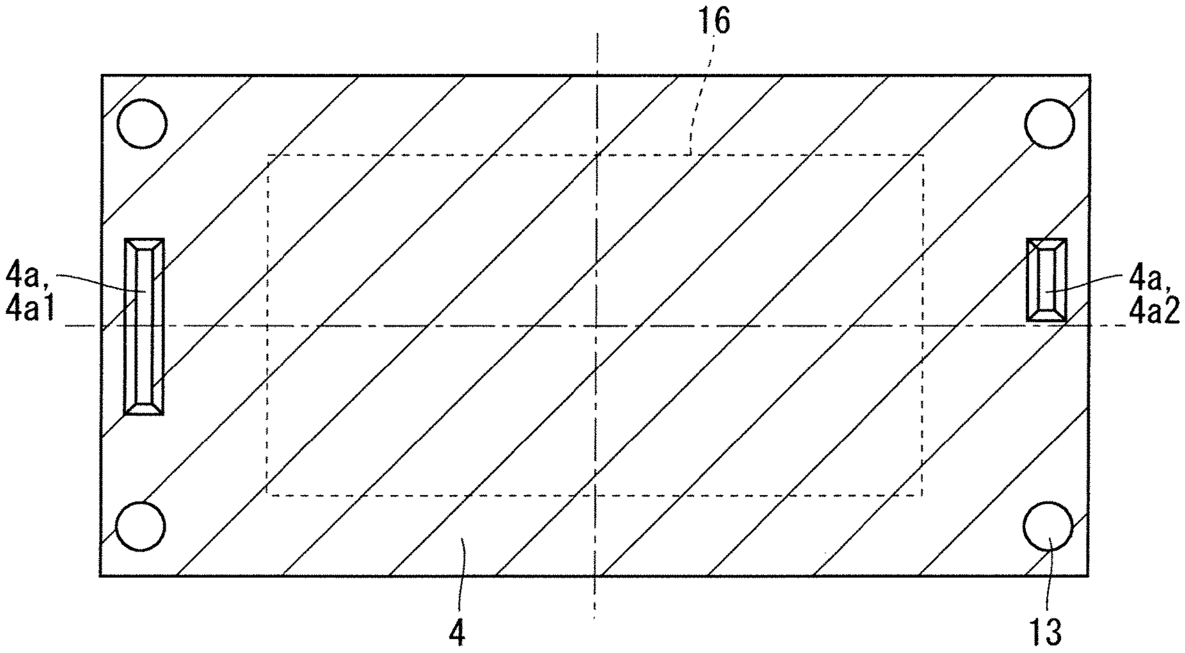
FIG. 6 is a plan view illustrating a configuration of a part of a semiconductor device according to a combination of the embodiments 2 and 3.

As illustrated in FIG. 6, the configuration of the present embodiment 3 may be combined with the configuration of the embodiment 2. According to such a configuration, the error in assembly can be further suppressed.

Embodiment 4

Figure 7:
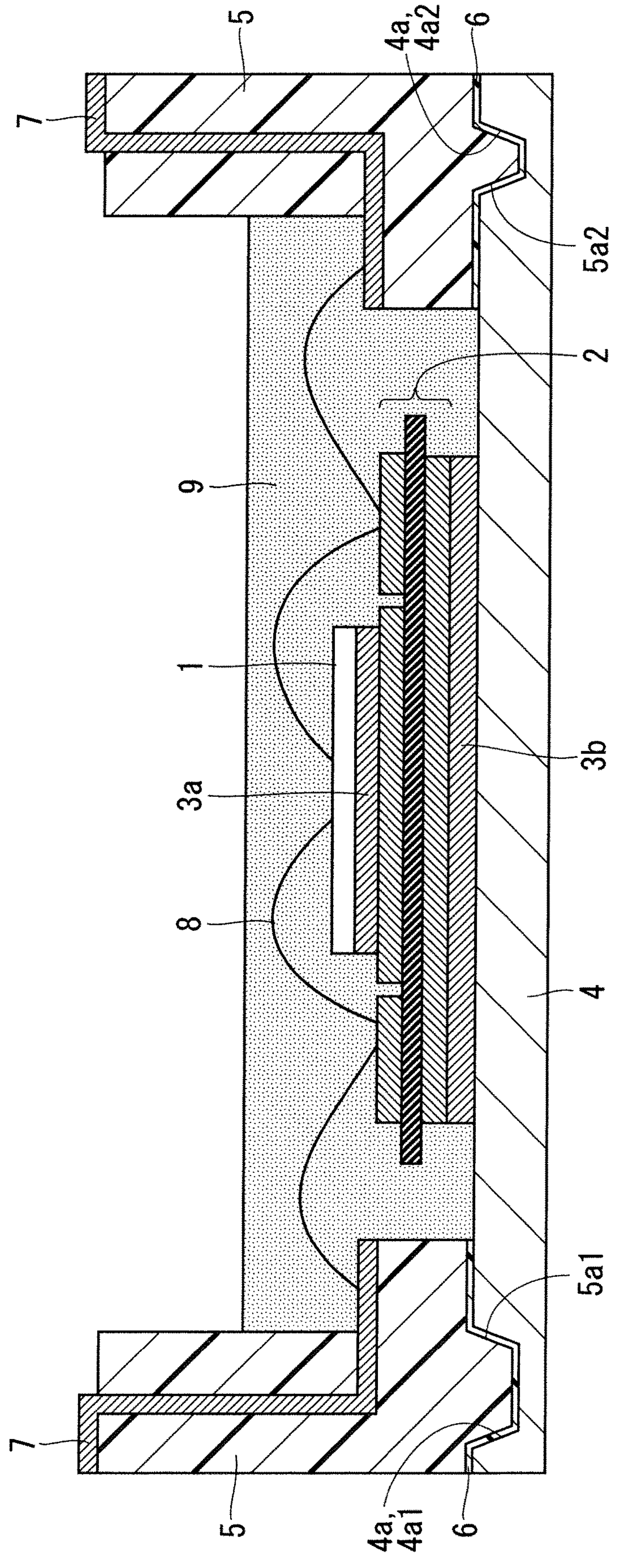
FIG. 7 is a cross-sectional view illustrating a configuration of a semiconductor device according to an embodiment 4.

FIG. 7 is a cross-sectional view illustrating a configuration of a semiconductor device according to the present embodiment 4. In the present embodiment 4, the plurality of convex portions 5*a* include a first convex portion 5*a*1 and a second convex portion 5*a*2 having shapes different from each other in a cross-sectional view, and the plurality of concave portions 4*a* include the first concave portion 4*a*1 and the second concave portion 4*a*2 having shapes different from each other in a cross-sectional view.

In FIG. 7, as an example thereof, at least a part of a size of a shape of the first concave portion 4*a*1 (for example, a size of a lateral width or a taper angle) and at least a part of a size of a shape of the second concave portion 4*a*2 (for example, a size of a lateral width or a taper angle) are different from each other. Although not shown in the drawings, a type of the shape of the first concave portion 4*a*1 and a type of the shape of the second concave portion 4*a*2 may be different from each other as with a case where the shape of the first concave portion 4*a*1 is a tapered shape with zero level and the shape of the second concave portion 4*a*2 is a tapered shape with one level. The same applies to the first convex portion 5*a*1 and the second convex portion 5*a*2.

Outline of Embodiment 4

In the semiconductor device according to the present embodiment 4, the plurality of convex portions include the first convex portion and the second convex portion having shapes different from each other in a cross-sectional view, and the plurality of concave portions include the first concave portion and the second concave portion having shapes different from each other in a cross-sectional view. According to such a configuration, when the case 5 is rotated by 180 degrees from a designed state with respect to the base plate 4, the convex portion and the concave portion are not fitted to each other in one or more groups of convex portion and the concave portion, thus an error in assembly can be suppressed in the manner similar to the embodiment 2.

The configuration of the present embodiment 4 may be combined with at least one of the configurations of the embodiment 2 and the embodiment 3. According to such a configuration, the error in assembly can be further suppressed.

Embodiment 5

Figure 8:
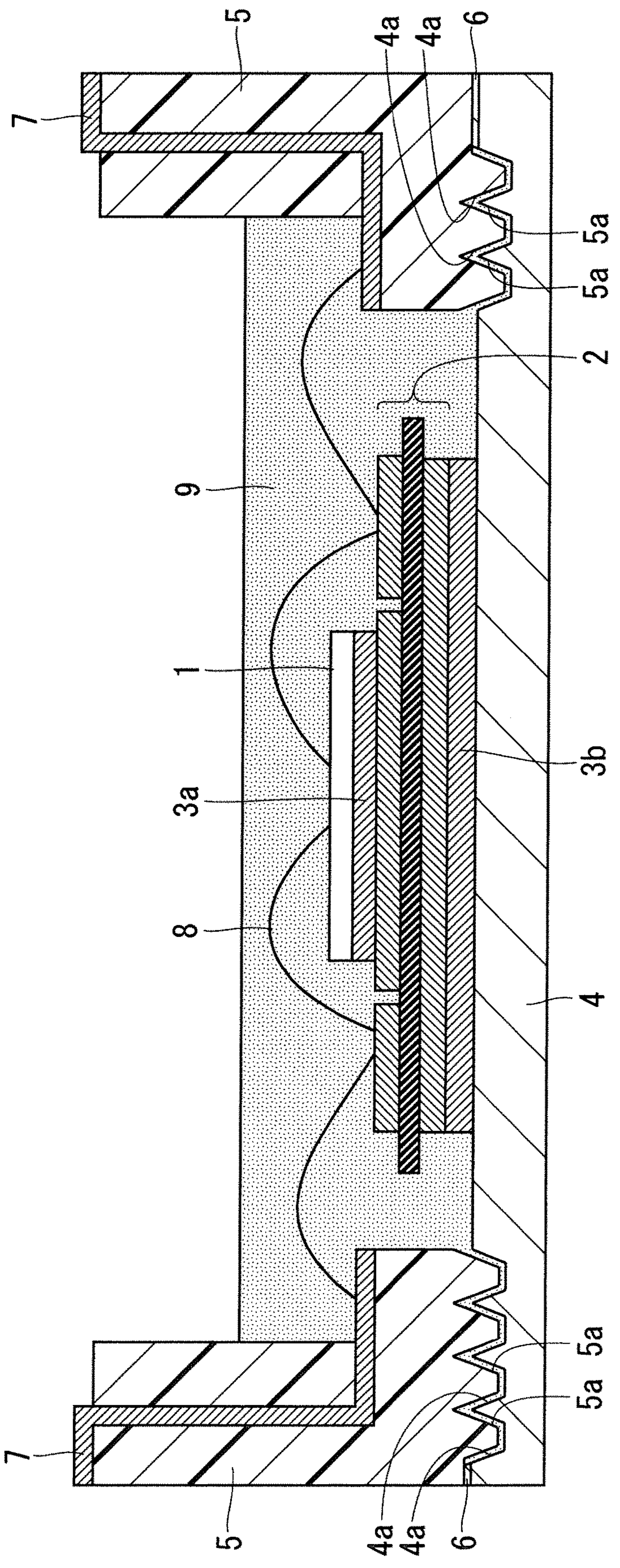
FIG. 8 is a cross-sectional view illustrating a configuration of a semiconductor device according to an embodiment 5.

FIG. 8 is a cross-sectional view illustrating a configuration of a semiconductor device according to the present embodiment 5. In the present embodiment 5, the plurality of convex portions 5*a* are adjacent to each other in a direction from a center portion of the case 5 toward an outer peripheral portion, and the plurality of concave portions 4*a* are adjacent to each other in a direction from a center portion of the base plate 4 toward an outer peripheral portion. The plurality of convex portions 5*a* and the plurality of concave portions 4*a* may be provided in whole peripheries of the case 5 and the base plate 4, respectively.

Outline of Embodiment 5

According to the present embodiment 5 described above, a creeping distance from an outer side of the base plate 4 and the case 5 to an inner space can be longer than that in the embodiment 1, thus fluid reaching electrical components can be further suppressed. The plurality of convex portions are adjacent to each other and the plurality of concave portions are adjacent to each other, thus a size of the whole plurality of convex portions and a size of the whole plurality of concave portions can be reduced, and as a result, reduction in size of the semiconductor device can be expected.

The configuration of the present embodiment 5 may be combined with at least one of the configurations of the embodiment 2, the embodiment 3, and the embodiment 4. For example, shapes of each convex portion and each concave portion may be different from each other in the present embodiment 5. According to such a configuration, the error in assembly can be suppressed.

Each embodiment and each modification example can be arbitrarily combined, or each embodiment and each modification can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a semiconductor element;

an insulating substrate on which the semiconductor element is mounted;

a base plate on which the insulating substrate is mounted; and a case mounted on the base plate to surround the semiconductor element and the insulating substrate, wherein one or more convex portions each having a tapered shape are provided in one of a surface of the base plate and a surface of the case, one or more concave portions each having a tapered shape to be fitted to the one or more convex portions are provided in another one of the surface of the base plate and the surface of the case, and the base plate and the case define an attaching hole collectively passing through a planar surface of a distal end of the convex portion and a planar surface of a bottom of the concave portion facing each other in a perpendicular direction of the planar surfaces.

2. The semiconductor device according to claim 1, wherein the one or more convex portions or the one or more concave portions are asymmetrically disposed in the base plate or the case in a plan view.

3. The semiconductor device according to claim 1, wherein the one or more convex portions are a plurality of convex portions, and the one or more concave portions are a plurality of concave portions fitted to the plurality of convex portions, respectively.

4. The semiconductor device according to claim 3, wherein the plurality of convex portions include a first convex portion and a second convex portion having shapes different from each other in a plan view, and the plurality of concave portions include a first concave portion and a second concave portion having shapes different from each other in a plan view.

5. The semiconductor device according to claim 3, wherein the plurality of convex portions include a first convex portion and a second convex portion having shapes different from each other in a cross-sectional view, and the plurality of concave portions include a first concave portion and a second concave portion having shapes different from each other in a cross-sectional view.

6. The semiconductor device according to claim 3, wherein the plurality of convex portions are adjacent to each other, and the plurality of concave portions are adjacent to each other.

7. The semiconductor device according to claim 1, wherein a gap is provided between the convex portion and the concave portion facing each other, and at least one of an adhesive agent and a sealing member is provided in the gap.

* * * * *